(12) United States Patent
Funakoshi et al.

(10) Patent No.: US 7,671,465 B2
(45) Date of Patent: Mar. 2, 2010

(54) POWER SEMICONDUCTOR MODULE

(75) Inventors: Sunao Funakoshi, Kasumigaura (JP);
Katsumi Ishikawa, Hitachinaka (JP);
Tasao Soga, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 136 days.

(21) Appl. No.: 11/657,458

(22) Filed: Jan. 25, 2007

(65) Prior Publication Data

US 2007/0216013 A1    Sep. 20, 2007

(30) Foreign Application Priority Data

Mar. 20, 2006    (JP) ............................. 2006-075883

(51) Int. Cl.
*H01L 23/10* (2006.01)
(52) U.S. Cl. ...................... 257/706; 257/717
(58) Field of Classification Search ................ 257/276, 257/278, 625, 691, E23.101, E23.103
See application file for complete search history.

(56) References Cited

U.S. PATENT DOCUMENTS

| | | | |
|---|---|---|---|
| 6,448,645 B1 | 9/2002 | Kimura et al. | |
| 6,703,707 B1 * | 3/2004 | Mamitsu et al. | 257/718 |
| 7,193,326 B2 * | 3/2007 | Hirano et al. | 257/765 |
| 7,456,492 B2 * | 11/2008 | Mochida | 257/659 |
| 2003/0199121 A1 * | 10/2003 | Caletka et al. | 438/113 |
| 2004/0056346 A1 | 3/2004 | Palm et al. | |
| 2006/0022326 A1 | 2/2006 | Morita et al. | |

FOREIGN PATENT DOCUMENTS

| | | |
|---|---|---|
| JP | 2000/068447 | 3/2000 |
| JP | 2003-017658 | 1/2003 |
| JP | 2005/310925 | 11/2005 |

OTHER PUBLICATIONS

German Office Action in Appln. No. 10 2007 004 005.0-33; with complete English translation of Official Action dated Apr. 28, 2008.

* cited by examiner

*Primary Examiner*—Wai-Sing Louie
*Assistant Examiner*—Bilkis Jahan
(74) *Attorney, Agent, or Firm*—Antonelli, Terry, Stout & Kraus, LLP (57) ABSTRACT

A power semiconductor module having an increased reliability against thermal fatigue includes a power semiconductor element, a lower-side electrode connected to the lower side of the element, a first insulating substrate connected to the upper side of the lower-side electrode and having metallic foils bonded on both surfaces thereof, an upper-side electrode connected to the upper side of the power semiconductor element, a second insulating substrate connected to the upper side of the upper-side electrode and having metallic foils bonded on both surfaces thereof, a first heat spreader connected to the lower side of the first insulating substrate, and a second heat spreader connected to the upper side of the second insulating substrate. The power semiconductor element and the first and second insulating substrates are sealed with a resin.

16 Claims, 6 Drawing Sheets

POWER SEMICONDUCTOR MODULE

BACKGROUND OF THE INVENTION

The present invention relates to a power semiconductor module.

In order to make a power semiconductor module compact in size, it is necessary to minimize the size of a power semiconductor element or a cooling mechanism. For the miniaturization of the power semiconductor element, the element is required to reduce its loss. For the miniaturization of the cooling mechanism, it is effective to enable the element to be used at high temperatures. However, since the miniaturization involves an increase in heat generation density, more efficient cooling is required. The use of the element at high temperatures requires a reliability as high as endurable to thermal fatigue. JP-A-2003-17658 (Patent Document 1) discloses a structure wherein insulating substrates are provided each on the upper and lower surfaces of a power semiconductor, and heat sinks are provided at both sides of the semiconductor to cool the semiconductor from its upper and lower sides (refer to FIGS. 5 and 6, Paragraphs (0049)-(0056)).

SUMMARY OF THE INVENTION

In the prior art of Patent Document 1, the restraint of the power semiconductor element from its upper and lower sides involves an increase in distortion caused by a temperature change, which results in that a stress applied to the element or solder is increased with a reduced reliability. Thus it is demanded to secure a reliability.

It is therefore an object of the present invention to provide a power semiconductor module which has an increased reliability against thermal fatigue.

A power semiconductor module in accordance with the present invention includes a power semiconductor element, a lower-side electrode connected to the lower side of the element, a first insulating substrate connected to the lower side of the lower-side electrode and having metallic foils provided on its both surfaces, an upper-side electrode connected to the upper side of the power semiconductor element, a second insulating substrate connected to the upper side of the upper-side electrode and having metallic foils provided on its both surfaces, a first heat sink connected to the lower side of the first insulating substrate, and a second heat sink connected to the upper side of the second insulating substrate. The power semiconductor element, the first insulating substrate, and the second insulating substrate are sealed with a resin.

In accordance with the present invention, the power semiconductor element can be minimized, the entire power semiconductor module can be minimized, and a high reliability against thermal fatigue can be secured.

Other objects, features and advantages of the invention will become apparent from the following description of the embodiments of the invention taken in conjunction with the accompanying drawings.

DESCRIPTION OF THE EMBODIMENTS

Details of the present invention will be explained with reference to the accompanying drawings.

Embodiment 1

Figure 1:
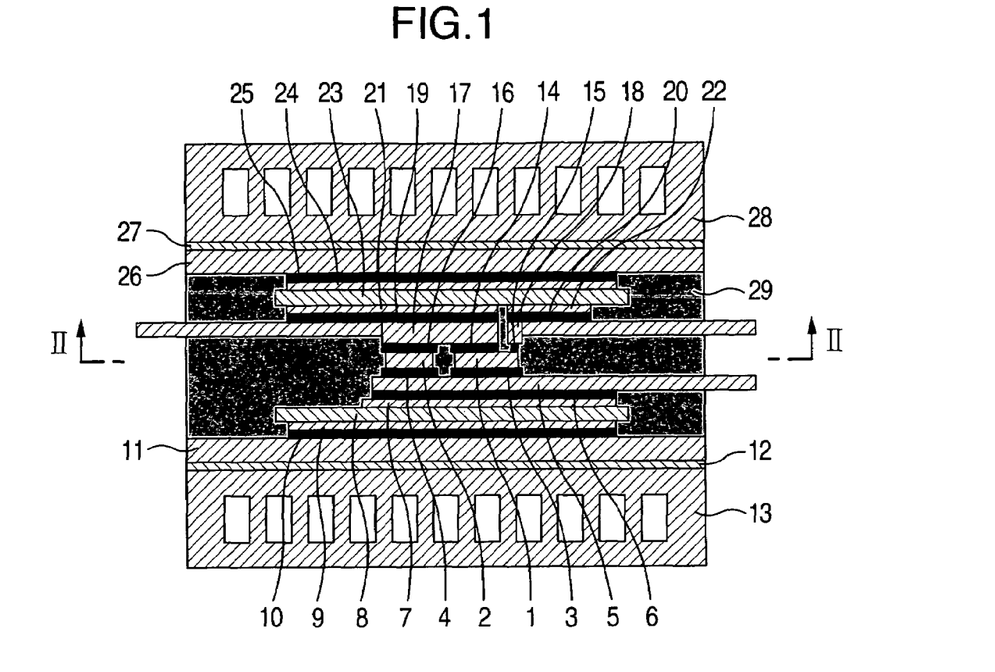
FIG. 1 shows a vertical cross-sectional view of a power semiconductor module in accordance with an embodiment 1.
Figure 2A:
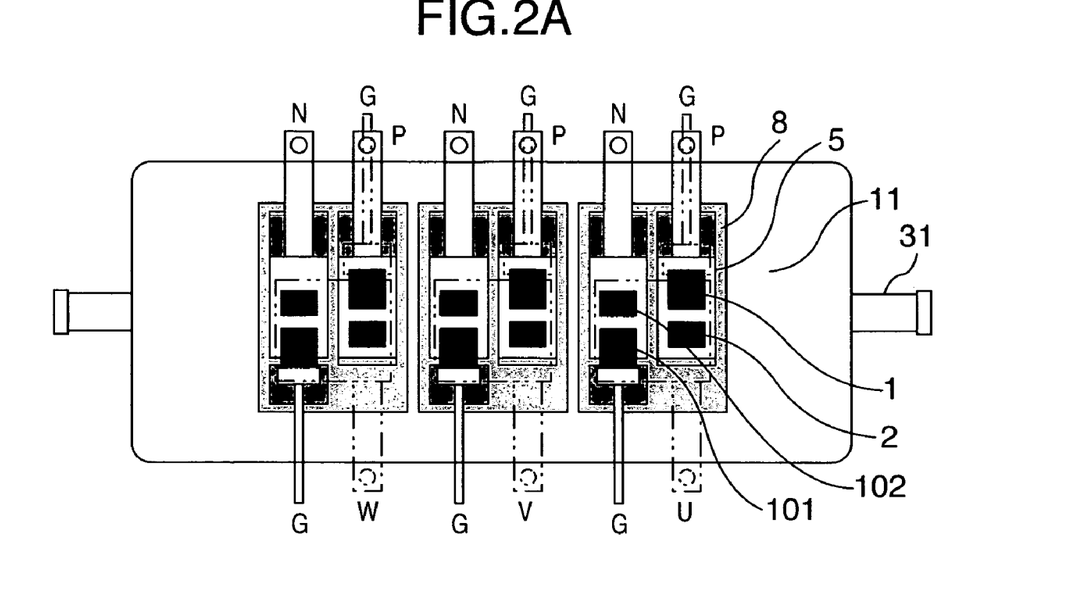
FIGS. 2A and 2B are horizontal cross-sectional views of the power semiconductor module of the embodiment 1.
Figure 2B:
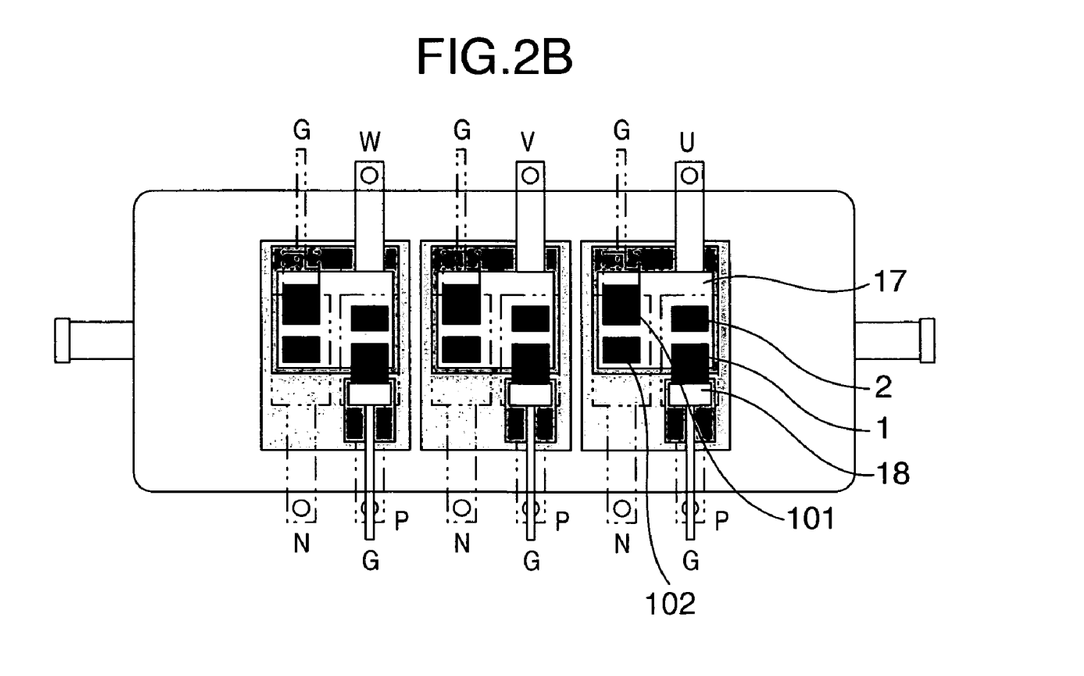

An embodiment of the present invention will be explained by referring to the drawings. FIG. 1 shows a vertical cross-sectional view of a power semiconductor module in accordance with the embodiment, and FIG. 2 shows a horizontal cross-sectional view thereof. Reference numeral 1 in FIG. 1 denotes a power semiconductor element such as an IGBT or a power MOS FET, and numeral 2 denotes a power semiconductor element such as a free-wheeling diode. The lower sides of the power semiconductor element 1 and the power semiconductor element 2 are bonded to a lower-side lead electrode 5 with first solders 3 and 4 disposed therebetween. The material of the lower-side lead electrode 5 may be made of copper. However, when the electrode material is made of a composite material (Cu—C) of copper and carbon having a small coefficient of linear expansion, a stress in the first solders 3 and 4 or in a second solder 6 caused by thermal deformation can be relaxed, thus increasing a reliability. The linear expansion coefficient of the Cu—C material is about $6 \times 10^{-6}$/K that is smaller than the linear expansion coefficient $17 \times 10^{-6}$/K of copper. A lower-side insulating substrate 8 is made of a material such as, e.g., aluminum nitride (AlN), alumina ($Al_2O_3$), silicon nitride ($Si_3N_4$), or boron nitride (BN). Copper foils 7, 9 (or aluminum foils) are previously bonded directly to both surfaces of the lower-side insulating substrate 8. The lower side of the lower-side lead electrode 5 is bonded onto a copper foil 7 provided on the upper side of the lower-side insulating substrate 8 with the second solder 6 disposed therebetween. The copper foil 9 provided on the lower surface of the lower-side insulating substrate 8 is bonded onto a lower-side copper base 11 (heat spreader) with a third solder 10 disposed therebetween. The lower-side copper base 11 is connected to a lower-side heat sink 13 by means of a not shown bolt or the like, and is tightly connected thereto with a grease 12 disposed therebetween. Or the aforementioned connection may be attained with use of a solder having a low melting point in place of the grease. For example, a solder of an Sn—In base or an Sn—Ag—Bi base having a melting point of about 100° C. which is lower than that of the second solder 6 may be employed.

The upper sides of the power semiconductor elements 1 and 2 are bonded to upper-side lead electrodes 17 and 18 with fourth solders 14, 15, and 16 disposed therebetween. The material of the upper-side lead electrodes 17 and 18 is also made of a copper material or a copper-carbon composite material like the lower-side lead electrode 5. An upper-side insulating substrate 23 is made of a material of aluminum nitride, alumina, silicon nitride or the like similarly to the lower-side insulating substrate 8. The upper-side insulating substrate 23 is bonded at its lower side to copper foils 21 and 22 (or aluminum foils) and at its upper side to a copper foil 24 (or aluminum foil). The upper-side lead electrodes 17 and 18 are bonded onto the copper foils 21 and 22 provided on the lower surface of the upper-side insulating substrate 23 with fifth solders 19 and 20 disposed therebetween. The thickness of parts of the upper-side lead electrodes 17 and 18 solder-bonded to the upper sides of the power semiconductor elements 1 and 2 is made to be larger than that of the other parts thereof. This is for the purpose of keeping a constant distance between the upper and lower electrodes to avoid possible discharging between the electrodes very close to each other at their ends. This requirement becomes high because, in particular, a silicon carbide (SiC) element to be explained later is made to be very thin.

The copper foil 24 on the upper side of the upper-side insulating substrate 23 is bonded to an upper-side copper base 26 with a sixth solder 25 disposed therebetween. The upper-side copper base 26 is connected to an upper-side heat sink 28 by means of a not shown bolt or the like, and is also tightly connected thereto with a grease 27 disposed therebetween. Also in this case, the aforementioned connection may be achieved with use of a solder having a low melting point.

All or some of the surfaces and side faces of the power semiconductor elements 1, 2, the insulating substrates 8, 23, the copper foils 7, 9, 21, 22, 24 (or aluminum foils), and the lead electrodes 5, 17, 18 are coated with soft resin such as polyimide-based resin, polyamide-imide-based resin, or the like to form a thin film. After cured or set, the structure is sealed with an epoxy-based molding resin 29. The sealing with the resin material may be made to form a transfer mold structure. When the structure is covered with the soft resin such as polyimide-based or polyamide-imide-based resin to form a thin film, a stress applied to the elements or solders by the deformation of the hard epoxy-based resin can be relaxed. As the sealing resin, an electrically-insulating and thermally-conductive resin is used. In order to make the thermal expansion of the sealing resin small, one or more of $SiO_2$, SiC, BN, $Si_3N_4$, AlN, or $Al_2O_3$ may be mixed in the resin as a filler or fillers. When a material having a linear expansion coefficient in a range of $7 \times 10^{-6}/K$ to $20 \times 10^{-6}/K$ and having a Young's modulus of 5 to 20 GPa is used as the epoxy-based resin material, a very high reliability can be secured. Further, when an element to be operated at high temperatures such as an SiC element to be explained later is employed, the sealing may be made with use of a resin having a glass transition temperature not lower than 200° C., for example, with use of a high-heat-resistance epoxy resin, a polyphenylene sulfide resin, a polycarbonate resin, a polyetherimide resin, or the like.

Part of the lower-side lead electrode 5 is extended up to the outer side of the mold resin 29 to form a connection terminal of a main power source or the like. Part of the upper-side lead electrode 17 is also extended up to the outer side of the mold resin 29 to form a connection terminal of a motor wiring line. Part of the upper-side lead electrode 18 is also extended up to the outer side of the mold resin 29 to form a control terminal of a gate or the like. An external signal for controlling the operation of the power element is input to the control terminal. A cooling medium flows through the lower-side and upper-side heat sinks 13 and 28 in such a manner as to cool the power semiconductor elements 1 and 2 from their both upper and lower sides. An anti-freezing solution is used as the cooling medium. The material of the upper- and lower-side heat sinks 13 and 28 is aluminum, copper or the like. When the power semiconductor element is cooled from its upper and lower sides in this way, the module can cope with a high heat generation density and can be made compact in size or miniaturized. The upper- and lower-side heat sinks 13 and 28 may employ, in some cases, an air cooling system having a fin for air cooling.

It is recommendable that all the solders be lead-free solders. As the first solders 3, 4 and the fourth solders 14, 15, 16 for bonding the power semiconductor elements 1, 2 and the upper- and lower-side lead electrodes 5, 17, 18; high temperature solders having, e.g., copper particles and tin particles mixed therein are used. Also as the second solder 6 for bonding the lower-side lead electrode 5 and the lower-side insulating substrate 8 as well as the fifth solders 19, 20 for bonding the upper-side lead electrodes 17, 18 and the upper-side insulating substrate 23; the same solder as mentioned above is used. The power semiconductor elements 1, 2, the upper- and lower-side lead electrodes 5, 17, 18, and the upper- and lower-side insulating substrates 8, 23 are bonded to each other by coating the elements, electrodes, and insulating substrates with the solder paste, stacking them each other, and heating and melting them simultaneously or individually. As the third solder 10 for bonding the lower-side insulating substrate 8 and the lower-side copper base 11 and as the sixth solder 25 for bonding the upper-side insulating substrate 23 and the upper-side copper base 26; a solder having a melting point or temperature lower than those of the first, fourth, second, and fifth solders, for example, an Sn-3Ag-0.5Cu lead-free solder may be used. The third and sixth solders 10 and 25 are heated and melted simultaneously or separately by turns for the bonding. At this time, it is desirable to employ an atmosphere furnace which also melts tin in the high-temperature side solders and which is combined with a vacuum furnace for voidless formation. The delamination of the resin can be avoided by providing dimples in the surfaces of the copper bases 11 and 26. In this case, in order no to bury the dimples, the surfaces of the copper bases 11 and 26 are not coated with polyimide or the like.

Explanation will next be made as to a planar layout of the power semiconductor elements and so on in connection with an example where an IGBT element is used as the power element, by referring to FIG. 1 and FIGS. 2A and 2B. FIG. 2A shows a cross-sectional view of the module when taken along a line II-II in FIG. 1 and viewed from its lower side, and FIG. 2B shows a cross-sectional view of the module when taken along the line II-II and viewed from its upper side. An IGBT (power semiconductor element 1) at the right end of FIG. 2A is arranged so that a current flows from the lower-side lead electrode 5 toward the upper-side lead electrode 17 in FIG. 1. In other words, the IGBT is arranged so that a collector electrode is provided at its lower side and an emitter electrode is provided at its upper side. A gate electrode is also arranged to be provided at its upper side. A free-wheeling diode (power semiconductor element 2) is arranged so that an anode is provided at its upper side and a cathode is provided at its lower side. An IGBT element 101 provided as the second element from the right end of the FIG. 2A is arranged so that a current flows from its upper side to the lower side. In other words, a collector electrode of the IGBT is provided at its upper side and an emitter electrode is provided at its lower side. A gate electrode of the IGBT is provided also at its lower end. A diode 102 is arranged so that an anode is provided at its lower end and a cathode is provided at its upper side. In FIG. 2B, the upper-side emitter-side lead electrode of the power semiconductor element 1 and a collector-side lead electrode of the IGBT element 101 are commonly connected to the upper-side lead electrode. With such an arrangement, since the elements can be arranged in a small space, the module can be made compact. The power semiconductor element has been made to have a rectangular shape in this example. However, in order to avoid stress concentration at corner parts, the shape of the element may have round corners. Even when the element is formed to have a circular shape, stress concentration at its corners can be avoided.

The power semiconductor element may be made of silicon (Si). When the power semiconductor element is made of wide gap semiconductor such as silicon carbide (SiC) or gallium nitride (GaN), however, the element can be used at higher temperatures and thus the element or its module can be made more compact. Since a rate of increase in loss with respect to increase in temperature is large in the SiC characteristic, a temperature sensor may be provided, for example, on the insulating substrate so as to prevent thermal runaway.

Although the expressions "upper-side" and "lower-side" have been used in the foregoing explanation for the convenience of explanation, the element may be arranged in a horizontal direction or in another direction. For example, when the element is arranged in the horizontal direction, the "upper-side" and "lower-side" may be replaced with "right-side" and "left-side".

In the present embodiment, since the power semiconductor element is cooled from its upper and lower sides, the strong cooling can be applied to a power semiconductor element having a high heat generation density. As a result, the power semiconductor element can be made compact and thus the entire power semiconductor module can be made compact. Since the coating of the soft resin such as polyimide-based resin or polyamide-imide-based resin and the transfer mold structure by the epoxy-based resin enable the stress concentration on the elements or the solder to be relaxed, a high reliability against thermal fatigue and so on can be secured.

Embodiment 2

Figure 3:
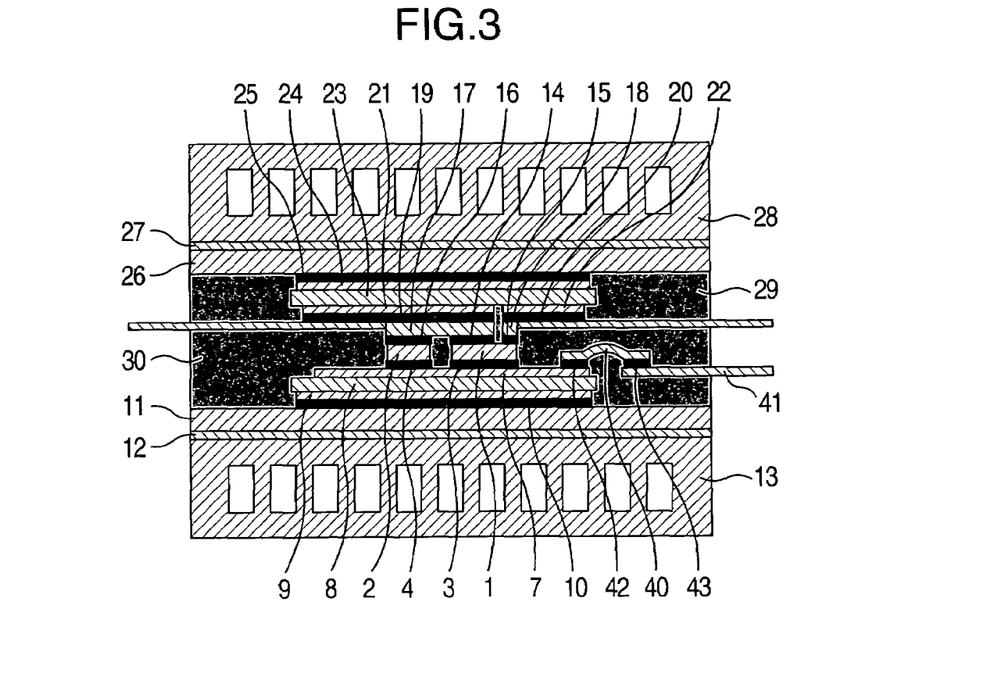
FIG. 3 is a cross-sectional view of a power semiconductor module in accordance with an embodiment 2.

FIG. 3 shows a cross-sectional view of a power semiconductor module in accordance with this embodiment. In the present embodiment, the lower sides of the power semiconductor elements 1 and 2 are bonded to the copper foil 7 of the insulating substrate. The power semiconductor elements 1 and 2 are bonded to the copper foil 7 with the first solders 3 and 4 disposed therebetween. A plate-like connection member 40 made of copper is connected to the copper foil 7 with a solder 42 disposed therebetween, and the connection member 40 in turn is connected to an electrode terminal 41 with a solder 43 disposed therebetween. Other arrangement is similar to that in the embodiment 1 and thus explanation thereof is omitted.

As the fourth solders 14 and 15 for bonding the power semiconductor elements 1, 2 and the upper-side lead electrodes 17, 18; a high temperature solder, e.g., having copper particles and tin particles mixed therein is used. Even for the first solders 3, 4 for bonding the power semiconductor elements 1, 2 and the lower-side insulating substrate 8 as well as the fifth solders 19, 20 for bonding the lead electrodes 17, 18 and the upper-side insulating substrate 23, the same high temperature solder is used. The power semiconductor elements 1, 2, the upper-side lead electrodes 17, 18, and the upper- and lower-side insulating substrates 8, 23 are bonded each other by applying a solder paste to the elements, electrodes, and substrates, stacking them together, heating and then melting them simultaneously or individually. As the third solder 10 for bonding the lower-side insulating substrate 8 and the lower-side copper base 11, the sixth solder 25 for bonding the upper-side insulating substrate 23 and the upper-side copper base 26, and the solders 42, 43 for bonding the electrode terminals; a solder having a melting point lower than those of the first solders 3, 4 and the fourth solders 14, 15, 16, and the fifth solders 19, 20, for example, a lead-free solder of Sn-3Ag-0.5Cu is used. The bonding is made by heating and melting the third solder 10, the sixth solder 25, and the solders 42, 43 simultaneously or individually.

In the present embodiment, since the electrode member is not used at the lower side, a thermal resistance can be made small, the power element and thus the entire power semiconductor module can be made more compact.

Embodiment 3

Figure 4:
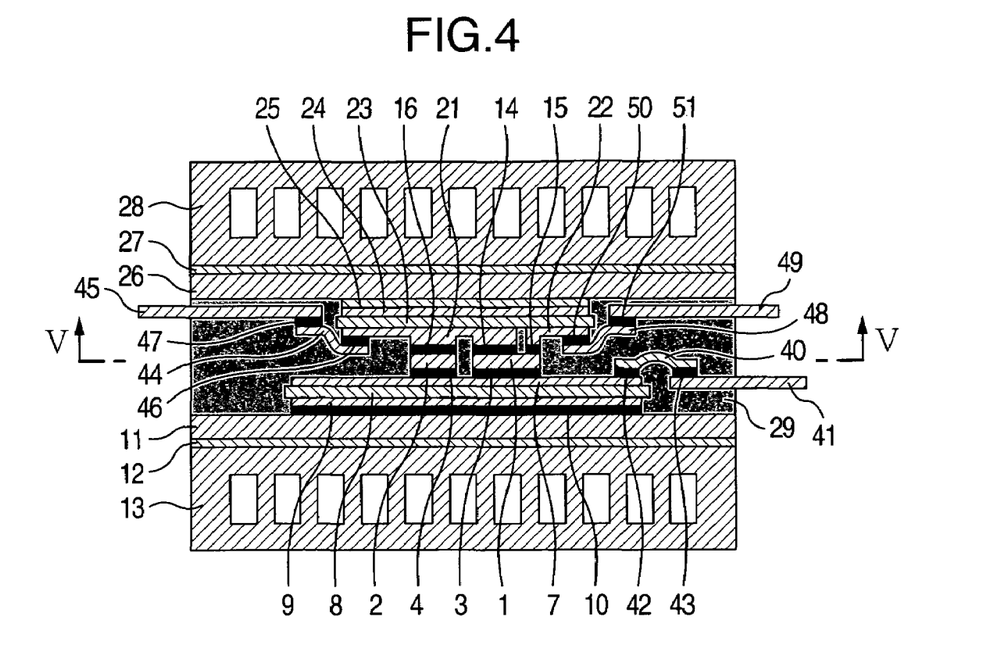
FIG. 4 is a vertical cross-sectional view of a power semiconductor module in accordance with an embodiment 3.
Figure 5A:
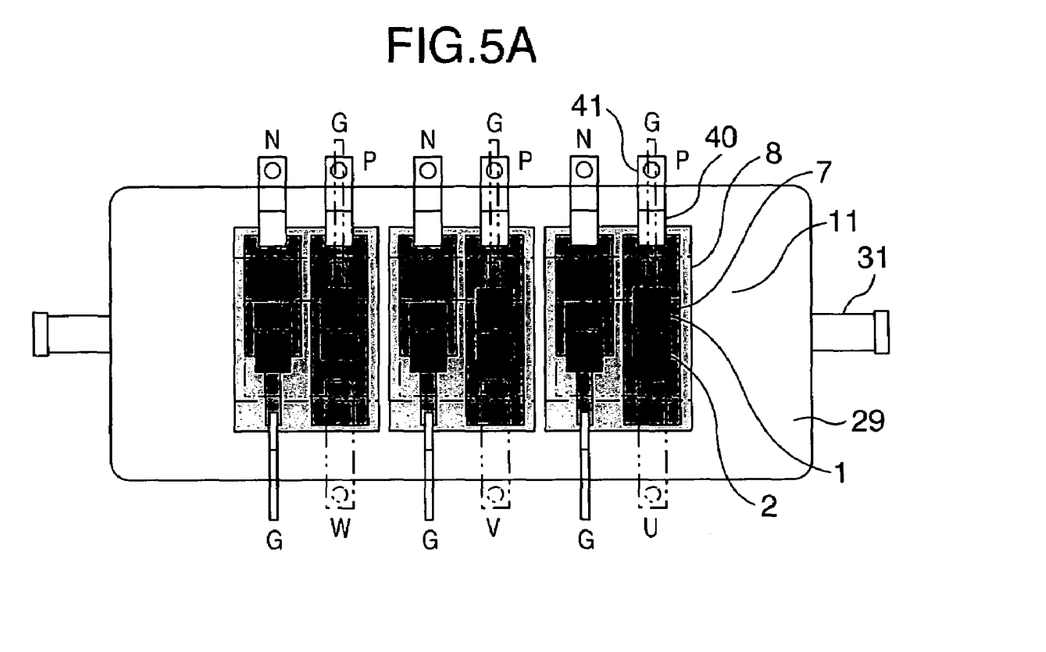
FIGS. 5A and 5B are horizontal cross-sectional views of the power semiconductor module of the embodiment 3.
Figure 5B:
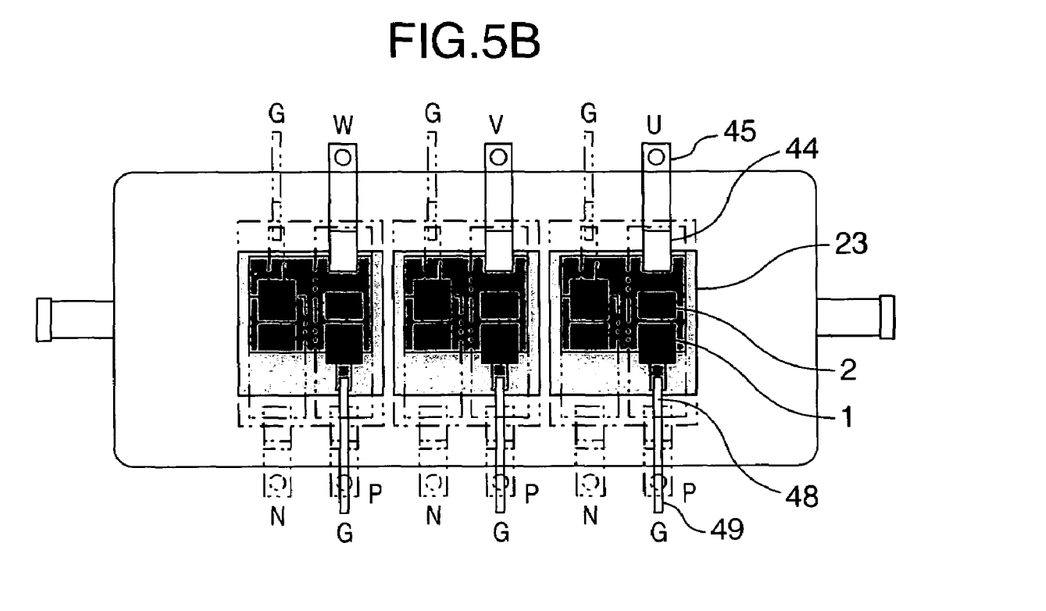

FIG. 4 shows a vertical cross-sectional view of a power semiconductor module in accordance with this embodiment, and FIGS. 5A and 5B show horizontal cross-sectional views thereof. More specifically, FIG. 5A is a cross-sectional view when taken along a line V-V in FIG. 4 and viewed from its lower side, and FIG. 5B is a cross-sectional view when taken along the line V-V and viewed from its upper side. In the present embodiment, the lower sides of the power semiconductor elements 1 and 2 are bonded to the copper foil 7 of the lower-side insulating substrate. The power semiconductor elements 1 and 2 are bonded to the copper foil 7 with the first solders 3 and 4 disposed therebetween. Meanwhile, the upper sides of the power semiconductor elements 1 and 2 are bonded to the copper foils 21 and 22 bonded to the upper-side insulating substrate 23. The power semiconductor elements 1 and 2 and the copper foils 21 and 22 are bonded together with the fourth solders 14, 15, and 16. The plate-shaped connection member 40 made of copper or the like is connected to the copper foil 7 via the solder 42 disposed therebetween, and the connection member 40 is connected to the electrode terminal 41 via the solder 43 disposed therebetween. A plate-shaped connection member 44 made of copper or the like is connected to a copper foil 21 via a solder 47 disposed therebetween. A plate-shaped connection member 48 made of copper or the like is connected to a copper foil 22 via a solder 50 disposed therebetween, and the connection member 48 is connected to an electrode terminal 49 via a solder 51 disposed therebetween. The thickness of a part of the copper foil bonded to the upper-side insulating substrate 23 which is bonded to the solder nearly at the upper part of the power semiconductor element is made to be larger than that of the other parts thereof. This is for the purpose of keeping a constant distance between the upper and lower electrodes so as to avoid discharging between the electrodes very close to each other at their ends. When the power semiconductor elements 1 and 2 have a sufficiently large thickness, the need of especially changing the thicknesses of the copper foils 21 and 22 at the element parts can be eliminated. In order to avoid interference between the connection members 40 and 48, further, the size of the lower-side insulating substrate 8 and the size of the upper-side insulating substrate 23 are changed.

As the fourth solders 14, 15, and 16 for bonding the power semiconductor elements 1 and 2 and the upper-side insulating substrate 23, a high temperature solder having, e.g., copper and tin particles mixed therein is used. Even for the first solders 3 and 4 for bonding the power semiconductor elements 1 and 2 and the lower-side insulating substrate 8, the same high temperature solder is used. The bonding is carried out, by applying a solder paste to the power semiconductor elements 1 and 2 and the upper- and lower-side insulating substrates 8 and 23, stacking them together, heating and then melting them simultaneously or individually. As the third solder 10 for bonding the lower-side insulating substrate 8 and the lower-side copper base 11, the sixth solder 25 for bonding the upper-side insulating substrate 23 and the upper-side copper base 26, and the solders 42, 43, 46, 47, 50, 51 for bonding the electrode terminals; a solder having a melting point lower than those of the first solders 3, 4 and the fourth solders 14, 15, 16, for example, a lead-free solder of Sn-3Ag-0.5Cu is used. The bonding is carried out, by heating and melting the third solder 10, the sixth solder 25, and the solders 42, 43, 46, 47, 50, 51 simultaneously or individually.

In the present embodiment, since the copper foils bonded to the upper- and lower-side insulating substrates 8 and 23 are used as the electrodes, a thermal resistance can be made small and the power semiconductor module can be made compact.

Embodiment 4

Figure 6:
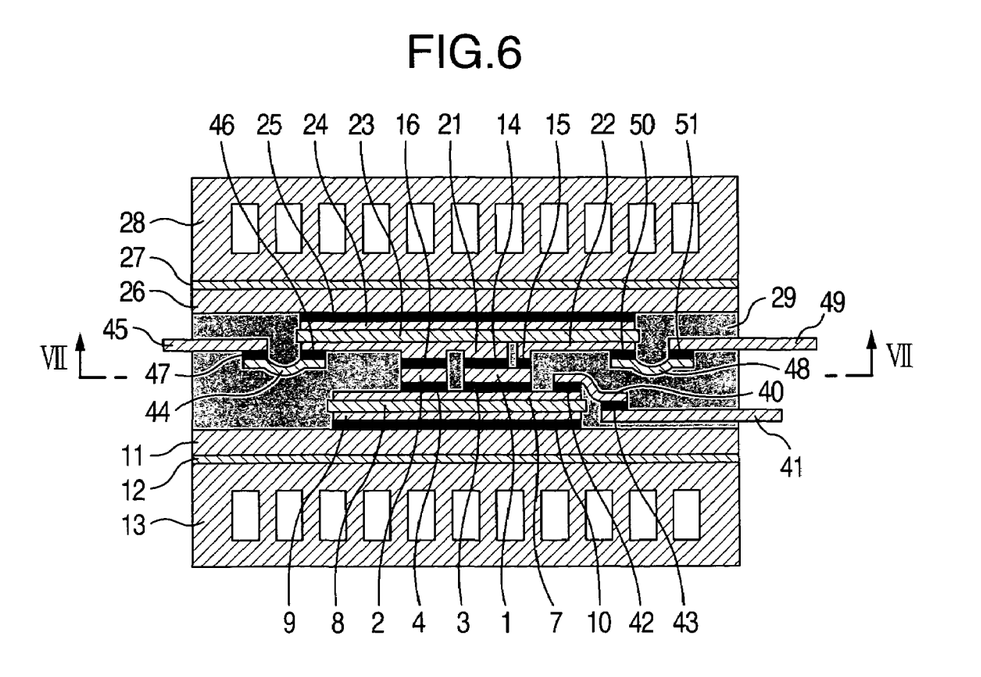
FIG. 6 is a vertical cross-sectional view of a power semiconductor module in accordance with an embodiment 4.
Figure 7A:
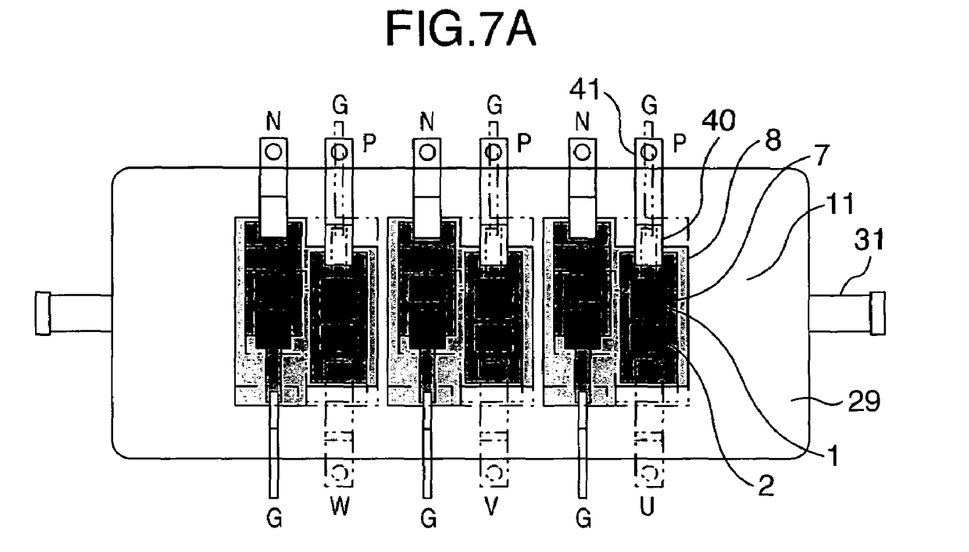
FIGS. 7A and 7B are horizontal cross-sectional views of the power semiconductor module of the embodiment 4.
Figure 7B:
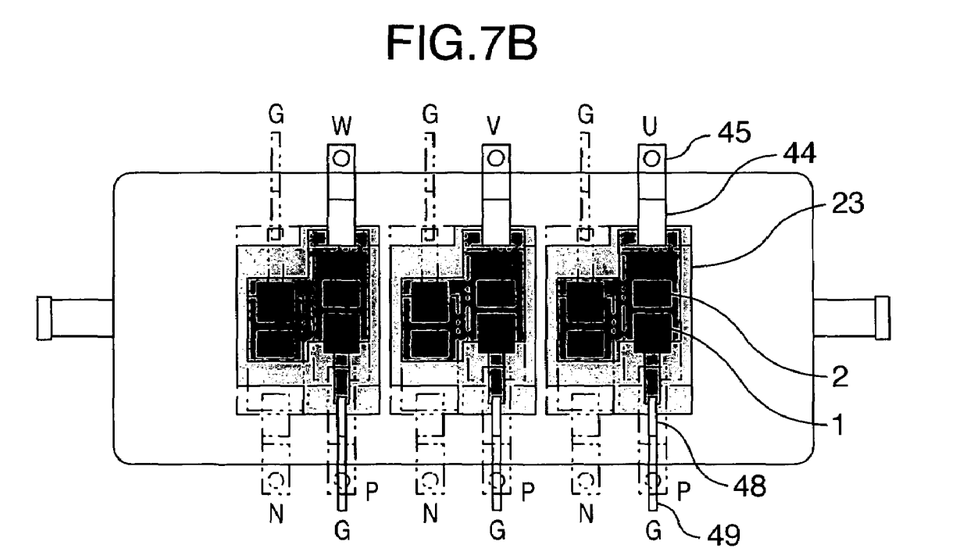

FIG. 6 shows a vertical cross-sectional view of a power semiconductor module in accordance with this embodiment, and FIGS. 7A and 7B show horizontal cross-sectional views thereof. More specifically, FIG. 7A is the cross-sectional view when taken along a line VII-VII in FIG. 6 and viewed from its lower side, and FIG. 7B is the cross-sectional view when taken along the line VII-VII and viewed from its upper side. Since its basic structure is similar to that of the embodiment 3, only different parts between the embodiments will be explained.

In the present embodiment, for the purpose of further reducing a mounting surface area, a notch is provided in part of the lower-side insulating substrate 8 and in part of the upper-side insulating substrate 23. As a result, since interference between the connection members 40 and 48 of the upper- and lower-side electrodes can be avoided, the size of the insulating substrate can be further reduced. Accordingly, in accordance with the present embodiment, the power semiconductor module can be made more compact.

Embodiment 5

Figure 8:
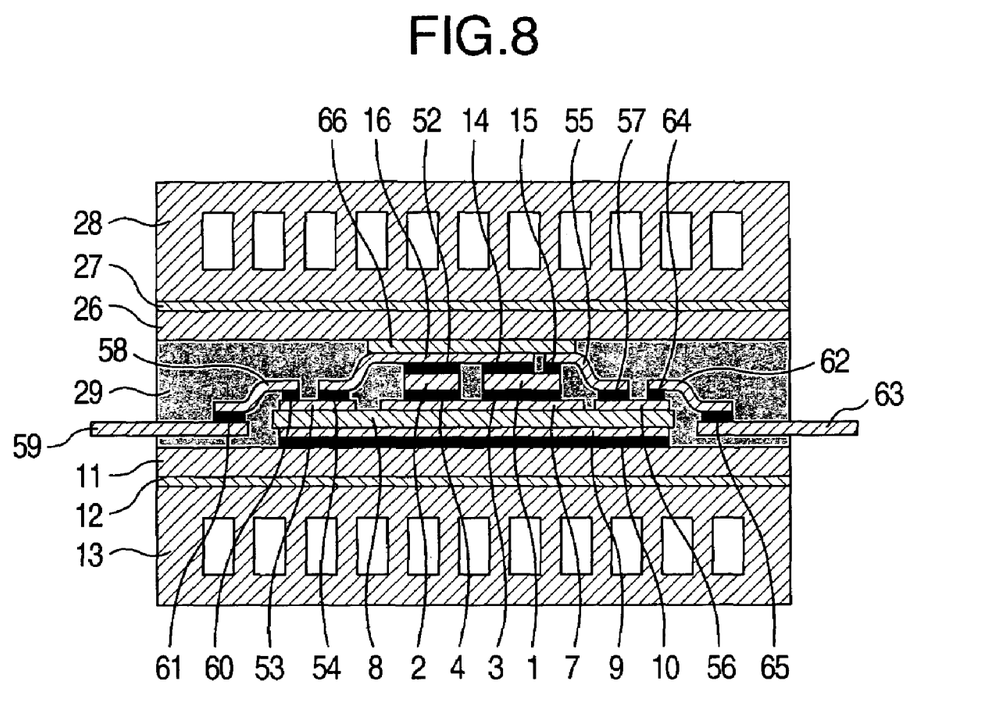
FIG. 8 is a cross-sectional view of a power semiconductor module in accordance with an embodiment 5.

FIG. 8 shows a cross-sectional view of a power semiconductor module in accordance with this embodiment. In FIG. 8, the copper foil 7 (aluminum foil) provided on the insulating substrate 8 is bonded to the lower sides of the power semiconductor elements 1 and 2 with the first solder 3 and 4 disposed therebetween. The insulating substrate 8 is made of a material such as aluminum nitride (AlN), alumina ($Al_2O_3$) or silicon nitride (SiN). The copper foils 7, 53, 56 (or aluminum foils) are previously bonded directly to the upper surface of the insulating substrate 8, and the copper foil 9 (aluminum foil) is previously bonded directly to the lower surface of the insulating substrate 8.

The copper foil 9 provided on the lower surface of the lower-side insulating substrate 8 and the lower-side copper base 11 are bonded together with the third solder 10 disposed therebetween. The lower-side copper base 11 is connected to the lower-side heat sink 13 by means of a bolt or the like, and is tightly connected thereto via the grease 12 disposed therebetween. The upper side of the power semiconductor elements 1 and 2 is bonded to upper-side lead electrodes 52 and 55 with fourth solders 14, 15, and 16 disposed therebetween. The upper-side lead electrodes 52 and 55 are made of copper or a copper-carbon composite material. The upper-side lead electrode 52 is further bonded to a copper foil 53 provided on the insulating substrate 8 with a solder 54 disposed therebetween. An electrode bonding member 57 is bonded to the copper foil 53 with a solder 60 disposed therebetween, and the electrode bonding member 57 is also connected to an electrode terminal 58 with a solder 61 disposed therebetween. Another upper-side lead electrode 55 is bonded to a copper foil 56 provided on the insulating substrate 8 with a solder disposed therebetween. An electrode bonding member 62 is bonded to the copper foil 56 with a solder 64 disposed therebetween, and the electrode bonding member 62 is also bonded to a terminal 63 with a solder 65 disposed therebetween.

An electrically-insulating resin material 66 having a relatively large thermal conductivity is tightly contacted with the upper sides of the upper-side lead electrodes 52 and 55, and the copper base 26 as a second heat spreader is provided on the upper surface of the resin material 66. The upper-side copper base 26 as the second heat spreader is connected to the upper-side heat sink 28 by means of a bolt or the like, and is tightly connected thereto via the grease 27 disposed therebetween. With such an arrangement, heat generated in the power element is effectively transmitted through the lead electrode into the lower-side heat spreader, and also through the resin material 66 into the upper-side heat spreader.

A transfer mold structure by the mold resin 29 is formed around the power semiconductor elements 1 and 2. More specifically, all or some of the surfaces and side faces of the power semiconductor elements 1, 2, the insulating substrate 8, the copper foils 7, 53, 56 bonded to the insulating substrate are covered with a thin film of soft resin such as polyimide-based resin or a polyamide-imide-based resin. After cured, the resultant structure is sealed with epoxy resin to form a transfer mold structure. Since the structure is covered with a thin film of soft resin such as polyimide-based resin or polyamide-imide-bases resin, a stress applied to the element caused by the deformation of the epoxy-based resin due to temperature change can be relaxed.

According to the present embodiment, since the power semiconductor element is cooled from its upper and lower sides, effective cooling can be applied even to a power semiconductor element having a high heat generation density and thus the entire power semiconductor module can be made compact. Further, because of the coating of the soft resin such as polyimide-based resin or polyamide-imide-based resin and also because of the transfer mold structure by epoxy-based resin, a high reliability against thermal fatigue or the like can be secured while avoiding application of a large stress to the power semiconductor element, etc.

It should be further understood by those skilled in the art that although the foregoing description has been made on embodiments of the invention, the invention is not limited thereto and various changes and modifications may be made without departing from the spirit of the invention and the scope of the appended claims.

We claim:

1. A power semiconductor module comprising:
a power semiconductor element;
a lower-side electrode connected to a lower side of the power semiconductor element;
a first insulating substrate connected to a lower side of the lower-side electrode and having metallic foils bonded on opposing major surfaces thereof;
an upper-side electrode connected to an upper side of the power semiconductor element;
a second insulating substrate connected to an upper side of the upper-side electrode and having metallic foils bonded onto opposing major surfaces thereof;
a first heat spreader connected via a first solder to a lower side of the first insulating substrate;
a second heat spreader connected via a second solder to an upper side of the second insulating substrate;
a first heat sink connected via a third solder to a lower side of the first heat spreader and adjacent with a cooling medium;

a second heat sink connected via a fourth solder to an upper side of the second heat spreader and adjacent with the cooling medium, wherein the power semiconductor element, the first insulating substrate, the second insulating substrate, the first heat spreader and the second heat spreader are sealed with resin such that the resin is in contact with surfaces of the first and second heat spreaders, and wherein the first and second heat spreaders include dimples formed in the surfaces thereof that contact the resin to prevent delamination of the resin from said surfaces.

2. A power semiconductor module according to claim 1, wherein a thickness of a part of the upper-side electrode bonded to the upper part of the power semiconductor element is larger than that of a part of the upper-side electrode not bonded to the upper pad of the power semiconductor element.

3. A power semiconductor module according to claim 1, wherein at least any of the upper-side electrode and the lower-side electrode is made of a copper-carbon composite material (Cu—C).

4. A power semiconductor module according to claim 1, wherein a high temperature solder having copper and tin particles mixed therein is used as a solder for bonding the power semiconductor element and the upper-side electrode or the lower-side electrode and as a solder for bonding the upper-side electrode or the lower-side electrode and the first or second insulating substrate; and a solder having a melting temperature lower than that of the high temperature solder is used as a solder for bonding the first or second insulating substrate and the first or second heat spreader.

5. A power semiconductor module according to claim 1, wherein the first insulating substrate is different in shape from the second insulating substrate, and the adjacent power semiconductor elements are arranged so that currents flowing through the adjacent power semiconductor elements and through the first insulating substrate are opposed in direction to each other.

6. A power semiconductor module according to claim 1, wherein the third and fourth solders are solders having a lower melting temperature than that of the first and second solders.

7. A power semiconductor module according to claim 1, wherein at least some surfaces of the power semiconductor element, the first and second insulating substrates and the lower-side and upper-side electrodes are coated with polyimide-based resin or polyamide-imide-based resin.

8. The power semiconductor module according to claim 1, wherein the first and second heat sinks are in direct contact with the cooling medium.

9. A power semiconductor module comprising:
a power semiconductor element;
a first insulating substrate connected to a lower side of the power semiconductor element and having metallic foils bonded to opposing major surfaces thereof;
an upper-side electrode connected to an upper side of the power semiconductor element;
a second insulating substrate connected to an upper side of the upper-side electrode and having metallic foils bonded to opposing major surfaces thereof;
a first heat spreader connected via a first solder to a lower side of the first insulating substrate;
a second heat spreader connected via a second solder to an upper side of the second insulating substrate;
a first heat sink connected via a third solder to a lower side of the first heat spreader and adjacent with a cooling medium; and
a second heat sink connected via a fourth solder to an upper side of the second heat spreader and adjacent with the cooling medium, wherein the power semiconductor element, the first insulating substrate, the second insulating substrate, the first heat spreader and the second heat spreader are sealed with resin such that the resin is in contact with surfaces of the first and second heat spreaders, and wherein the first and second heat spreaders include dimples formed in the surfaces thereof that contact the resin to prevent delamination of the resin from said surfaces.

10. A power semiconductor module according to claim 9, wherein a thickness of a part of the upper-side electrode bonded to the upper part of the power semiconductor element is larger than that of a part of the upper-side electrode not bonded to the upper part of the power semiconductor element.

11. A power semiconductor module according to claim 9, wherein at least the upper-side electrode is made of a copper-carbon composite material (Cu—C).

12. A power semiconductor module according to claim 9, wherein a high temperature solder having copper and tin particles mixed therein is used as a solder for bonding the power semiconductor element and the upper-side electrode and as a solder for bonding the upper-side electrode and the metallic foil bonded to the second insulating substrate, a solder having a melting point lower than that of the high temperature solder is used as a solder for bonding the first or second insulating substrate and the first or second heat spreader.

13. A power semiconductor module according to claim 9, wherein the first insulating substrate is different in shape from the second insulating substrate, and the adjacent power semiconductor elements provided on the first insulating substrate are arranged so that currents flowing through the adjacent power semiconductor elements are opposed in direction to each other.

14. The power semiconductor module according to claim 9, wherein the first and second heat sinks are in direct contact with the cooling medium.

15. A power semiconductor module according to claim 9, wherein the third and fourth solders are comprised of solders having a lower melting temperature than that of the first and second solders.

16. A power semiconductor module according to claim 9, wherein at least some of surfaces of the power semiconductor element, the first and second insulating substrates and the upper-side and lower-side electrodes are coated with polyimide-based resin or polyamide-imide-based resin.

* * * * *